(12) United States Patent
Sota

(10) Patent No.: US 6,403,895 B1
(45) Date of Patent: Jun. 11, 2002

(54) WIRING SUBSTANCE AND SEMICONDUCTOR

(75) Inventor: Yoshiki Sota, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/497,680

(22) Filed: Feb. 4, 2000

(30) Foreign Application Priority Data

Feb. 10, 1999 (JP) .............................. 11-032967

(51) Int. Cl.[7] .............................. H05K 1/16; H05K 1/11; H05K 7/10; H01L 23/02
(52) U.S. Cl. .................. 174/260; 174/261; 174/52.4; 361/767; 361/771
(58) Field of Search .................... 174/260, 261, 174/524, 262, 265; 361/760, 761, 767, 768, 777, 783, 771; 257/784, 780

(56) References Cited

U.S. PATENT DOCUMENTS 5,886,876 A  * 3/1999  Yamaguchi ................. 361/767

6,132,543 A  * 10/2000  Mohri et al. ............. 156/89.12

FOREIGN PATENT DOCUMENTS

| JP | 1-88460 U | 6/1989 |
| JP | 4-24929 A | 1/1992 |

* cited by examiner

*Primary Examiner*—Kamand Cureo
*Assistant Examiner*—Quynh-Nhu H. Vu
(74) *Attorney, Agent, or Firm*—Nixon & Vanderhye P.C.

(57) ABSTRACT

A semiconductor device includes a wiring substrate which includes a wiring pattern provided per each wiring with a land covering an external terminal mounting perforation for mounting an external terminal, said land being provided on a side of the wiring pattern on which side a semiconductor chip is mounted, wherein a plurality of second pads for electrically connecting the wiring and the semiconductor chip by wire bonding are provided per each wiring, and at least one of the second pads is provided between lands.

11 Claims, 10 Drawing Sheets

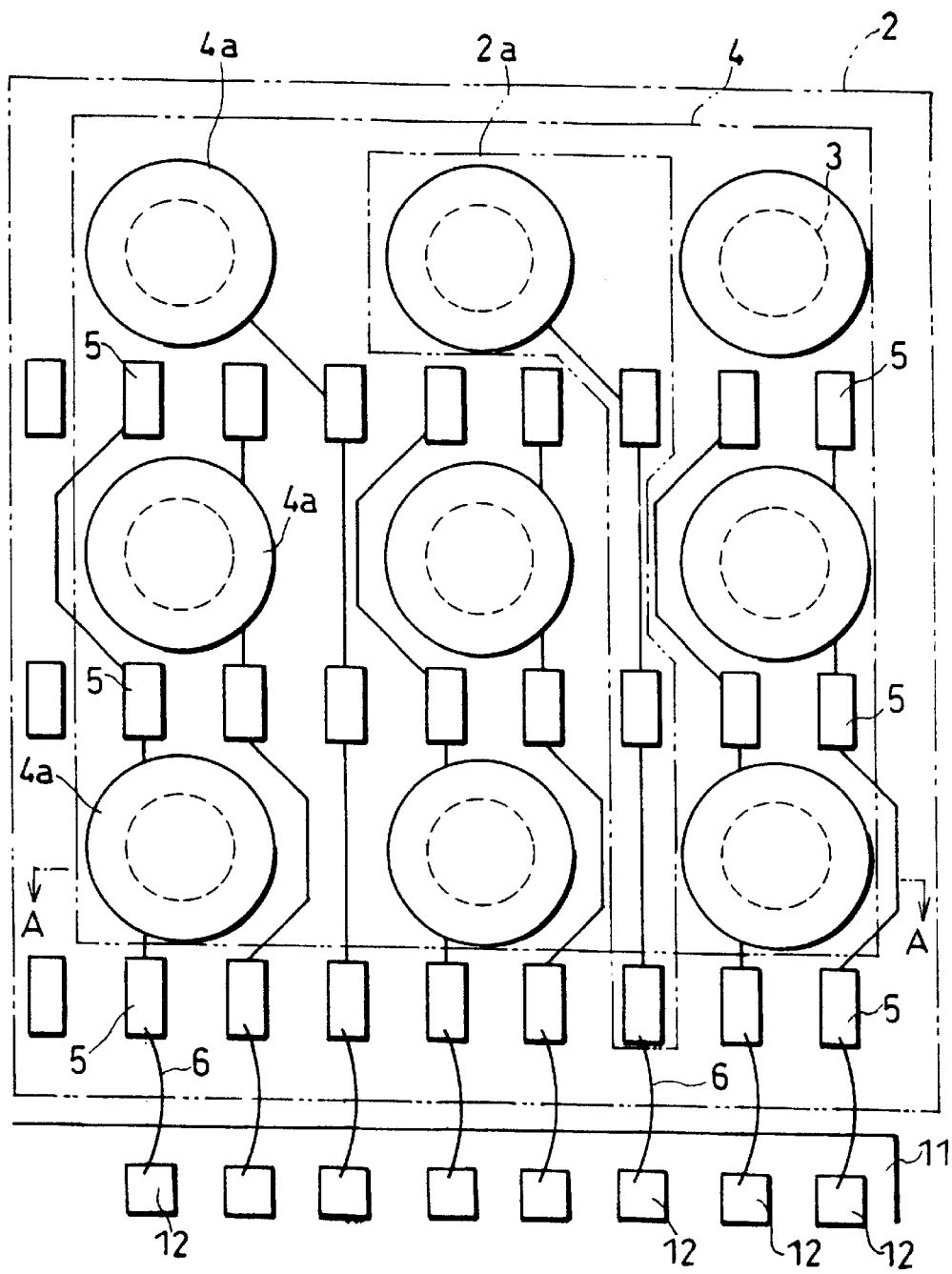

WIRING SUBSTANCE AND SEMICONDUCTOR

FIELD OF THE INVENTION

The present invention relates to a semiconductor device package, in particular to a wiring substrate to be used for a package of a semiconductor device of a BGA (Ball Grid Array) type, and a semiconductor device employing such a wiring substrate.

BACKGROUND OF THE INVENTION

As shown in FIG. 8(a) and FIG. 8(b), in a conventional resin sealed type semiconductor device of a BGA type employing a bonding wire, a semiconductor chip 71 is provided, with its circuit portion facing above, on a substrate 73 on which a wiring pattern 72 is provided on the side where the semiconductor chip 71 is mounted. Also, a metal thin wire connection electrode pad 74, which is an electrode terminal to be connected to the semiconductor chip 71 and which is provided at an end of each wiring of the wiring pattern 72, is connected to an output terminal 71a of the semiconductor chip 71 by a metal wire 75 (thin wire). Thus, the wiring pattern 72 on the substrate 73 and the semiconductor chip 71 are electrically conducted, and thereafter sealing is made so that the semiconductor chip 71, wiring pattern 72, and wire 75, etc., are coated with resin.

The resin sealed type semiconductor device includes a solder ball 76 (external terminal) which is provided on the other side of the resin sealed surface of the substrate 73. The solder ball 76 constitutes a signal terminal for electrically connecting each wiring of the wiring pattern 72 to an external circuit via a perforation 73a (external terminal mounting perforation) provided through the substrate 73. The resin sealed type semiconductor device is made into a final product by being cut into individual pieces of an external size (package size) of the resin sealed type semiconductor device per semiconductor chip 71.

Some of such resin sealed type semiconductor devices adopt a wiring substrate in which wiring pattern 72 is made of a metal of a single layer. In this kind of resin sealed type semiconductor device, in the case where the number of external terminals, i.e., the number of signal terminals which need to be externally connected, is large and the semiconductor chip 71 is small as compared with the package size, the distance from the semiconductor chip 71 to the metal thin wire connection electrode pad 74 on the substrate 73 becomes long. As a result, there is a tendency that the length of the wire 75 for connecting the semiconductor chip 71 and the metal thin wire connection electrode pad 74 is increased. This tendency becomes more prominent when the external size of the resin sealed type semiconductor device is increased due to the increased number of external terminals, for example, by an increase in number of signal terminals, and/or when the size of the semiconductor chip 71 (semiconductor chip size) is reduced while the number of signal terminals remains unchanged.

Further, as the length of wire 75 is increased by the increased difference in size between the external size of the resin sealed type semiconductor device and the semiconductor chip 71, the angle of wire 75 with respect to the semiconductor chip 71 (wire angle) becomes smaller, and the intervals between the wires 75 are reduced. Thus, such a resin sealed type semiconductor device poses the problem that the wires 75 are susceptible to coming into contact with each other in a resin sealing step after wire bonding.

As described, the number of external terminals comprises the biggest factor in determining the external size of the resin sealed type semiconductor device, and also causes the wire contact between wires 75 as induced by the difference in size between the external size of the resin sealed type semiconductor device and the semiconductor chip 71. Other factors which determine the external size of the resin sealed type semiconductor device include, for example, the number of metal thin wire connection electrode pads.

When the metal thin wire connection electrode pads 74 are to be aligned in a single row as shown in FIG. 8(a) in a large number, the metal thin wire connection electrode pads 74 cannot be confined within the external size of the resin sealed type semiconductor device, and it is required as a result to position the metal thin wire connection electrode pads 74 outside of the external size of the resin sealed type semiconductor device. In such a case, the external size itself of the resin sealed type semiconductor device needs to be made large and the problem of wire contact between wires 75 is induced.

Meanwhile, in order to align all the metal thin wire connection electrode pads 74 within a desired external size of the resin sealed type semiconductor device, the metal thin wire connection electrode pads 74 may be aligned in plural rows, e.g., in two rows, by shifting the positions of metal thin wire connection electrode pads 74 of adjacent wiring. However, with this method, the pitch of the metal thin wire connection electrode pads 74 becomes small, and causes the problem of wire contact between the wires 75 to occur in the vicinity of the metal thin wire connection electrode pads 74, and also causes wire bonding tools to come into contact with each other, and thus this method still does not solve the problem of wire contact between wires 75 in the resin sealing step after connecting wires 75. In particular, when the wire angle is small between the semiconductor chip 71 and the position of the metal thin wire connection electrode pads 74 on the substrate 73, the distance between the wires 75 is further reduced, and the danger of contact between wires 75 and between wire bonding tools is increased.

Further, when the number of external terminals (signal terminals) is large and the pitch between external terminals is small, by various limitations such as, for example, wire length and wire angle, it may be necessary to provide the metal thin wire connection electrode pads 74 at a position from which wire bonding cannot be made directly from the semiconductor chip 71. In such a case, the external terminals which are connected to such metal thin wire connection electrode pads 74 cannot be used as the signal terminals.

As described, the problem of wire contact, which often occurs when the semiconductor chip size is relatively smaller than the package size and when the number of metal thin wire connection electrode pads is large, is inflicted by wire length and wire angle.

A wiring pattern having a large number of metal thin wire connection electrode pads is disclosed, for example, in Japanese Unexamined Utility Model No. 84460/1989 (Jitsukaihei 1-84460) (published date: Jun. 5, 1989), in which plural kinds of semiconductor chips having different configurations are aligned and mounted on the same single substrate without any change in the wiring pattern. As shown in FIG. 9, the wiring pattern is provided such that on a substrate 84 mounting semiconductor chips 81, 82, and 83 (chip parts), plural lines L1 to Ln are formed, and the lines L1 to Ln are provided, at an end of each line, with a plurality of metal thin wire connection electrode pads P1 to Pn and Q1 to Qn (bonding pads) which are to be used for wire bonding with the output terminals 81a, 82a, and 83a of the semiconductor chips 81, 82, and 83, respectively, by which the lines L1 to Ln extend toward a heat generating body via the metal thin wire connection electrode pads Q1 to Qn from the metal thin wire connection electrode pads P1 to Pn as a starting point.

Thus, in the above wiring pattern, wire bonding is made in accordance with the shapes of the semiconductor chips 81, 82, and 83 so that, for example, with respect to the semiconductor chip 81, the output terminals 81a of the semiconductor chip 81 and the exposed metal thin wire connection electrode pads P1 and P3, P2m–1, P2, P4, and P2m on the first two rows are connected to each other by wire bonding, and with respect to the semiconductor chip 82 which is larger than the semiconductor chip 81, the semiconductor chip 82 is mounted on top of the metal thin wire connection electrode pads of the first two rows, and the output terminals 82a of the semiconductor chip 82 are connected to the metal thin wire connection electrode pads Q2a–1, Q2a+1, Q2a, and Q2a+2 on the last two rows, thus adding a degree of freedom in bonding position between the output terminals 81a, 82a, and 83a of the semiconductor chips 81, 82, and 83 and the metal thin wire connection electrode pads P1 to Pn and Q1 to Qn, and allowing optimum metal thin wire connection electrode pads to be selected for the semiconductor chips 81, 82, and 83 having a difference size.

Further, in the above wiring pattern, by selecting optimum metal thin wire connection electrode pads P1 to Pn and Q1 to Qn for each of the semiconductor chips 81, 82, and 83 having a different size, the length of the wire connecting the output terminals 81a, 82a, and 83a of the semiconductor chips 81, 82, and 83 and the metal thin wire connection electrode pads P1 to Pn and Q1 to Qn of the wiring pattern can be reduced.

Meanwhile, in order to be compatible with the multi-pins of highly integrated semiconductor chips and to eliminate the limitation imposed by the wire length, Japanese Unexamined Patent Publication No. 24929/1992 (Tokukaihei 4-24929) (published date: Jan. 28, 1992) discloses a ceramic package as shown in FIG. 10, in which a relay circuit pattern 94 having a relay substrate 95 on its upper surface is provided between a bonding portion (metal thin wire connection electrode pad) 91a of a circuit pattern 91 which is to be connected to external leads and a mount region of a semiconductor chip 92, where one end of the relay circuit pattern 94 is connected to an output terminal 92a of the semiconductor chip 92 by a bonding wire 93 and the other end is connected to the bonding portion 91a of the circuit pattern 91 by the bonding wire 93.

In this ceramic package, the semiconductor chip 92 and the circuit pattern 91 are connected to each other via the relay circuit pattern 94 which is provided on the relay substrate 95 between the semiconductor chip 92 and the circuit pattern 91, and for this reason as compared with the case where the semiconductor chip 92 and the circuit pattern 91 are connected to each other by direct wire bonding, the length of wire 93 can be reduced, thus making the device compatible with the multi-pins.

However, in the package of the resin sealed type semiconductor device of a BGA type, as shown in FIG. 8(a) and FIG. 8(b), on the wiring pattern 72 is provided a land pattern (a group of lands 72a) composed of lands 72a covering the external terminal mounting perforations 73a.

Thus, when the arrangement of Japanese Unexamined Utility Model No. 84460/1989 (Jitsukaihei 1-84460), in which rows of plural metal thin wire connection electrode pads are formed at an end of each wiring is applied to the wiring pattern 72 of the wiring substrate used in the resin sealed type semiconductor device of a BGA type as shown in FIG. 8(a) and FIG. 8(b), the rows of metal thin wire connection electrode pads 74 are provided separately from the land pattern (a group of lands 72a). As a result, the area on the substrate other than the area where the land pattern is formed cannot be used efficiently, and the package size is increased.

Further, the ceramic package as disclosed in Japanese Unexamined Patent Publication No. 24929/1992 (Tokukaihei 4-24929) requires the special relay substrate 95 for relaying the bonding wires 93 as shown in FIG. 10, and the number of manufacturing steps and costs are increased.

SUMMARY OF THE INVENTION

It is an object of the present invention to inexpensively provide a wiring substrate and a semiconductor device with a good yield, which are capable of reducing wire length and preventing wire contact even when a semiconductor chip is smaller than a package size.

In order to achieve the above object, a wiring substrate of the present invention includes a wiring pattern provided per each wiring with a land covering a perforation for mounting an external terminal, the land being provided on a side of the wiring pattern on which side a semiconductor chip is mounted, wherein a plurality of electrode terminals (e.g., metal thin wire connection electrode pads having a quadrilateral or pentagonal shape) for electrically connecting the wiring and the semiconductor chip by wire bonding are provided per each wiring, and at least one of the plurality of electrode terminals is provided between lands.

With this arrangement, by the provision of the plurality of electrode terminals per each wiring, the electrode terminals for electrically connecting each wiring and the semiconductor chip can be flexibly changed. Further, by the provision of the electrode terminals between lands, the number of electrode terminals can be increased without causing increase in external size (package size) of the semiconductor device, and also the layout of wiring where wires are likely to contact with each other in wire bonding can be easily changed, and the trouble such as wire contact between wires can be prevented.

Thus, with the above arrangement, even when the number of, for example, external terminals is large and the semiconductor chip is smaller than the external size (package size) of the semiconductor device, the wires are prevented from coming into contact with each other in wire bonding between the semiconductor chip and each wiring provided on the wiring substrate. Further, with the above arrangement, it is not required to provide a special relay substrate, etc., in addition to the wiring pattern, thus realizing an inexpensive arrangement. As a result, it is possible to provide a wiring substrate which can realize an inexpensive semiconductor device which can be manufactured with a good yield.

In order to achieve the foregoing object, another wiring substrate of the present invention includes a wiring pattern provided per each wiring with a land covering a perforation for mounting an external terminal, the land being provided on a side of the wiring pattern on which side a semiconductor chip is mounted, wherein electrode terminals for electrically connecting the wiring and the semiconductor chip by wire bonding are provided between lands, and relay wiring (e.g., wiring having relaying metal thin wire connecting pads at the both ends) for electrically connecting the electrode terminals and the semiconductor chip by wire bonding is provided between the wiring pattern and a semiconductor mounting region.

With this arrangement, even when the number of, for example, external terminals is large and the semiconductor chip is considerably smaller than the external size (package size) of the semiconductor device, or in the case where the external terminal pitch is narrow and there is no degree of freedom in positioning of the electrode terminals, or even when all wiring patterns are to be made of a metal of a single layer, the length of the wire used for wire bonding of the semiconductor chip and each wiring can be made shorter, thus preventing wire contact. Thus, with the above arrangement, it is possible to provide a wiring substrate which can realize an inexpensive semiconductor device which can be manufactured with a good yield.

In order to achieve the foregoing object, a semiconductor device of the present invention includes the above wiring substrate.

With this arrangement, because the semiconductor device includes the wiring substrate, even when the semiconductor chip is smaller than the package size, the wire length can be reduced, and it is possible to inexpensively provide a semiconductor device with a good yield, in which no wire contact occurs.

For a fuller understanding of the nature and advantages of the invention, reference should be made to the ensuing detailed description taken in conjunction with the accompanying drawings.

BRIEF DESCRIPTION OF THE DRAWINGS

FIG. 3 is a schematic drawing showing another example of the wiring pattern of the wiring substrate of the semiconductor device of FIG. 1.

FIG. 5 is changed.

DESCRIPTION OF THE EMBODIMENTS

The following will describe one embodiment of the present embodiment referring to FIG. 1 through FIG. 4.

Figure 1:
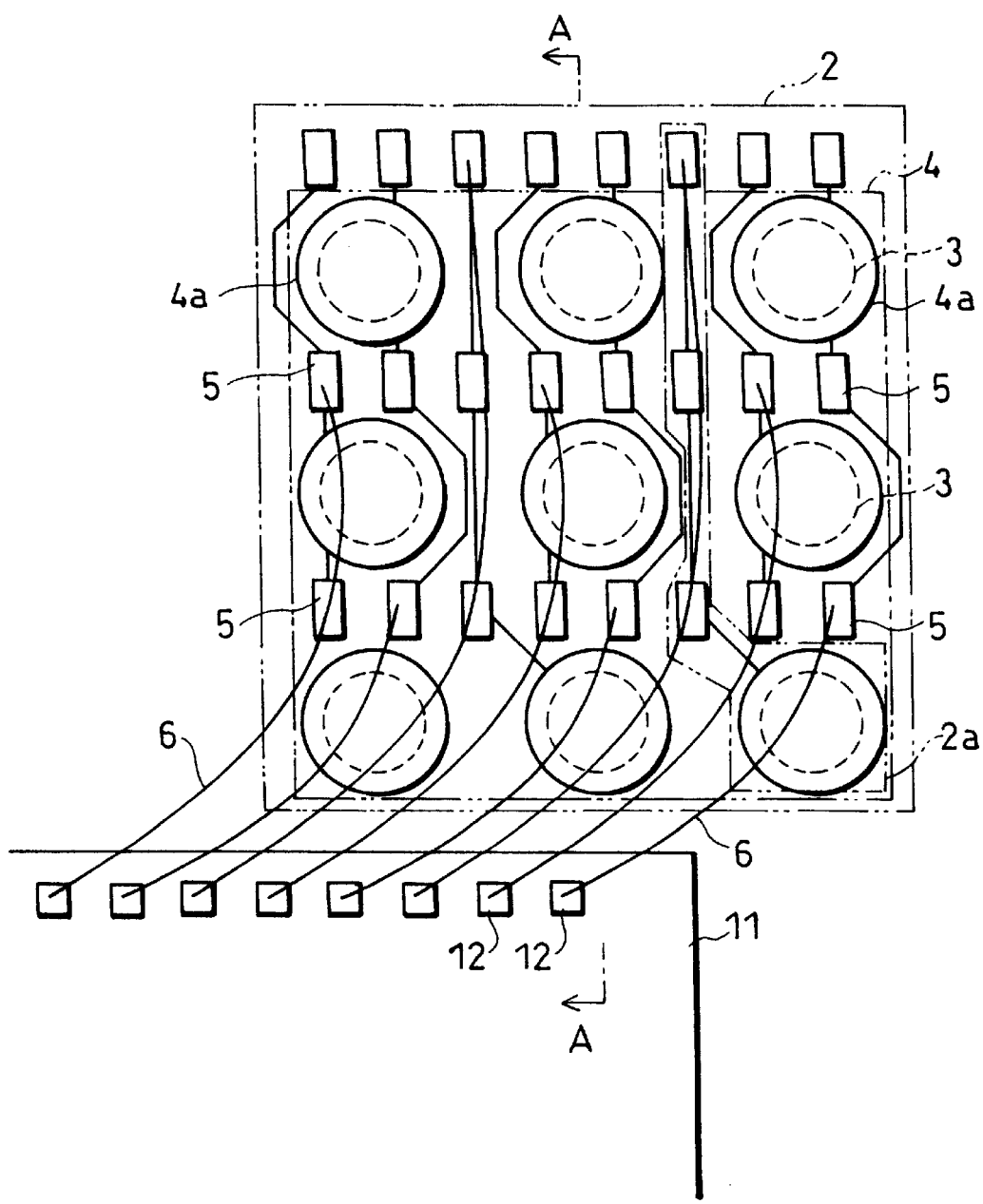
FIG. 1 is a schematic drawing of a wiring pattern of a wiring substrate of a semiconductor device in accordance with one embodiment of the present invention.
Figure 2:
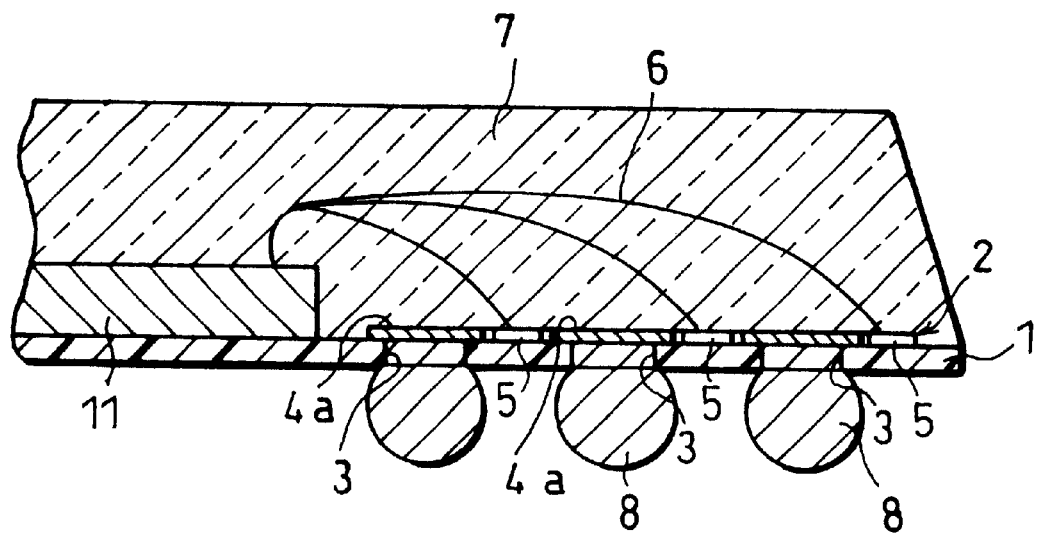
FIG. 2 is a cross sectional view of the semiconductor device of FIG. 1 taken along the line A—A.

As shown in FIG. 1 and FIG. 2, a semiconductor device in accordance with the present embodiment is provided with a wiring substrate (circuit substrate) having a wiring pattern 2 composed of a plurality of wiring 2a for electrically connecting a semiconductor chip 11 and an external circuit such as a mother board (not shown) via signal terminals ("external terminals" hereinafter) which are to be connected to the external circuit, and the wiring substrate is provided on a surface of a base substrate (insulating substrate) as a base material section made of an insulating material on which surface the semiconductor chip 11 is mounted.

On the wiring substrate, the wiring pattern 2 is arranged such that it is exposed on the surface of the base substrate 1 on which surface the semiconductor chip 11 is mounted. The base substrate 1 is provided with an external terminal mounting perforation 3 for mounting the external terminal for each wiring 2a, where the external terminal mounting perforation 3 is provided in plurality in the form of an area array. Over the side edge of the external terminal mounting perforations 3 where the wiring pattern 2 is formed, there is provided a land pattern 4 (a group of lands 4a) to constitute a portion of the wiring pattern 2 and as an external terminal connection wiring pattern, which is composed of lands 4a for forming the external terminals and which is formed in an area array. The lands 4a are provided to be larger than the external terminal mounting perforations 3 so as to cover the external terminal mounting perforations 3.

Further, the semiconductor device in accordance with the present embodiment is arranged such that conductive projections 8, for example, such as solder balls to be the external terminals are provided over the side edge of the external terminal mounting perforations 3 where the wiring pattern 2 is formed and via electrodes, for example, such as inner leads (not shown) which are provided within the external terminal mounting perforations 3.

Further, on a portion of the wiring pattern 2 are provided a plurality of second pads 5 (electrode terminals) per wiring 2a, which are provided as metal thin wire connection electrode pads for electrically connecting the wiring 2a of the wiring pattern 2 to a first pad 12 as an output terminal of the semiconductor chip 11. The second pads 5 are provided outside and inside of the land pattern 4 (a group of lands 4a) covering the external terminal mounting perforations 3 which are disposed in an area array, i.e., outside of the outer most land 4a (outside of the periphery of the outer most land 4a) of the land pattern 4 (a group of lands 4a), and inside the land pattern 4 (i.e., between the lands 4a of the land pattern 4), and the second pads 5 outside and inside of the land pattern 4 are both provided in a size which can be wire-bonded.

With this arrangement, in the semiconductor device in accordance with the present embodiment, the semiconductor chip 11 and the wiring pattern 2 are electrically connected to each other by wire bonding the first pads 12 and the second pads 5 one to one through a metal wire 6 (metal thin wire).

In the wiring pattern 2 as shown in FIG. 1, the second pads 5 are arranged such that, with respect to each wiring 2a, there is provided one second pad 5 outside of the land pattern 4 composed of lands 4a covering the external terminal mounting perforations 3 which are disposed in an area array, and there are provided two second pads 5 within the land pattern 4. The electrical conduction between each wiring 2a and the semiconductor chip 11 is made by wire bonding any one of the second pads 5 with the first pad 12 of the semiconductor chip 11 using the wire 6. The wire bonding between the second pad 5 of the wiring 2a and the first pad 12 of the semiconductor chip 11 is made by arbitrarily selecting the second pad 5 of each wiring 2a taking into account the wire length and wire angle so that the danger of wire contact between the wires 6 is reduced.

As described, in the described semiconductor device, the second pads 5 are provided in singularity outside of the land pattern 4 and in plurality within the land pattern 4 with respect to each wiring 2a, and it is possible to flexibly change the pad position (electrode terminal position) of wire bonding for making electrical connection between each wiring 2a and the semiconductor chip 11. As a result, the layout of the wiring 2a where the wires 6 are likely to contact with each other in wire bonding can be easily changed, and the trouble such as wire contact between the wires 6, which might occur in assemblage of the semiconductor device can be prevented.

The material to be used as the base substrate 1 is not particularly limited as long as it is superior in heat resistivity, insulating property, strength, and dimension stability. Specifically, as such a material, for example, polyimide, polyamide, BT (bismaleid-triazine) resin, epoxy resin, polyester, glass epoxy, glass polyimide, and ceramic are available, of which polyimide is particularly preferable in view of the cost and workability in processing. The insulation resistance of polyimide is around $5 \times 10^{13} \Omega$.

Also, the material of the wiring pattern 2 is not particularly limited as long as it has conductivity and heat resistance, and generally metal materials are used, of which copper (Cu) is preferable in view of cost. The thickness is not particularly limited and it is set around 12 $\mu$m, 18 $\mu$m, or 25 $\mu$m, which are the thicknesses of common wiring patterns.

Note that, in order to ensure insulation between the semiconductor chip 11 and the wiring pattern 2, an insulating sheet in the form of a film, or a solder resist, etc., may be formed on the wiring pattern 2. Further, in the semiconductor device in accordance with the present invention, as shown in FIG. 2, the wiring substrate is sealed by transmissive sealing resin 7, which covers the semiconductor device 11, wiring pattern 2, and wire 6, etc. Note that, in FIG. 1, for simplicity, the transmissive resin 7 is omitted. As the transmissive resin 7, for example, ordinary resin having transmissivity, which is used for conventional resin sealing is employed.

The following will describe a manufacturing method of the wiring substrate having the described arrangement.

The base material 1 adopted a polyimide base material on which a polyimide adhesive having superior heat resistance had been applied for laminating a copper foil on the side of the wiring pattern 2. The thickness of the base substrate 1 is not particularly limited, and in the present embodiment, a polyimide base material having a thickness of 50 $\mu$m to 75 $\mu$m, and an adhesive having a thickness of 7 $\mu$m to 12 $\mu$m were used. Note that, to prevent bowing of the wiring substrate, the adhesive may be applied on both sides of the polyimide base material.

To manufacture the wiring substrate, first, prior to laminating a copper foil, the external terminal mounting perforations 3 are formed beforehand in an area array through the base substrate 1 so as to form in advance a conduction path which connects the wiring pattern 2 to be formed on the base substrate 1 and the rear surface of the base substrate 1. To form the external terminal mounting perforations 3, for example, a laser process, drilling, or die-cutting using a mold is used.

Then, a copper foil for forming the wiring pattern 2 is laminated. In the present embodiment, as the copper foil for the wiring pattern 2, an electrolytic copper foil having a thickness of 18 $\mu$m was used.

Then, the wiring pattern 2 is formed in line with the position of the external terminal mounting perforations 3. Specifically, the land pattern 4 (a group of lands 4a) is formed in an area array to cover the external terminal mounting perforations 3, and the second pads 5 are formed outside (outer periphery) of the land pattern 4 and between the lands 4a covering the external terminal mounting perforations 3.

Evidently, each land 4a making up the land pattern 4 is required to be larger than the external terminal mounting perforation 3 to mask the external terminal mounting perforation 3. However, in consideration of the fact that the size of the land 4a with respect to the external terminal mounting perforation 3 has an effect on the bond strength of the lands 4a in the wiring pattern 2, and that the size required is determined by the positioning accuracy of the wiring pattern 2 and the land pattern 4, together with the level of manufacturing technique currently available, it is preferable that the distance between the edge of the external terminal mounting perforation 3 and the edge (end edge) of the land 4a is not less than 70 $\mu$m. Namely, to form the round land of the present embodiment, it is preferable that the opening diameter Y of the land 4a is $Y \geq (X+140 \mu m)$, where X is the opening diameter of the external terminal mounting perforation 3.

The shape of the land 4a is not just limited to the round shape, and other shapes such as a quadrilateral may be adopted, and as long as the external terminal mounting perforation 3 is covered, the shape is not particularly limited. In the present embodiment, the distance between the edge of the external terminal mounting perforation 3 and the edge of the land 4a is 100 $\mu$m.

Further, in designing of the present embodiment, the pitch between lands 4a was set at 0.8 mm, and the second pad 5 was configured to be a rectangle having a width of 0.15 mm and the length of 0.20 mm. The method of forming the wiring pattern 2 including the land pattern 4 and the second pads 5 is not particularly limited and, for example, an etching method may be adopted. Specifically, a photoresist is formed on the copper foil, and after exposure and development via a photomask bearing a predetermined pattern for the wiring pattern 2, the copper foil is etched using the resultant resist pattern as an etching mask, and thereafter by removing the resist pattern, the wiring pattern 2 is formed.

After forming the wiring pattern 2, the surface was gold-plated in a thickness of around 0.6 $\mu$m, considering the quality of bonding in wire bonding. This plating was made over the entire surface of the wiring substrate on which surface the semiconductor chip 11 is to be mounted (i.e., the surface of base substrate 1 on which surface the wiring pattern 2 was formed) and over a portion on the rear surface of the wiring substrate (other side of the substrate on which side the wiring pattern 2 is formed) where the copper foil is exposed from the external terminal mounting perforation 3 (land portion of external terminals).

Here, at the interface between copper and gold, nickel and palladium were plated in thicknesses of around 5 $\mu$m and 0.4 $\mu$m, respectively, so as to prevent interactive diffusion of copper and solder when the external terminals of solder are provided on the external terminal receptive surface.

The plating method is not particularly limited and electrolytic plating and non-electrolytic plating may be used, where the former requires wiring for plating. Such wiring extends out of the product semiconductor device, and the wiring needs to be cut finally, and when it is cut, the cut surface of the wiring is exposed. Thus, the present embodiment adopted non-electrolytic plating to carry out plating.

In the above wiring substrate, in the case where the external terminals are to be provided on a semiconductor chip mounting region, for example, a non-conductive film sheet (i.e., insulating sheet in the form of a film) is stacked on the wiring substrate 2 to ensure insulation between the wiring pattern 2 on the semiconductor chip mounting region and the semiconductor chip 11. Note that, for this purpose, for example, a liquid solder resist may be applied instead of the insulating sheet.

The following will describe an assembling method of the resin sealed type semiconductor device using the wiring substrate manufactured in the described manner.

First, a die-bond paste having an insulating property is applied over the semiconductor chip mounting region of the wiring substrate, and the semiconductor chip 11 is mounted. Then, the die-bond is cured to fix the semiconductor chip 11 (semiconductor chip fixing step).

Note that, as the method of fixing the semiconductor chip 11 on the wiring substrate, other than the method using the die-bond, it is possible alternatively to adopt a method in which the semiconductor chip 11 is bonded and fixed using an adhesive having adhesion for the insulating sheet which is stacked on the semiconductor chip mounting region of the wiring substrate. Further alternatively, an adhesive may be applied on the rear surface of the semiconductor chip 11 and the semiconductor chip 11 may be bonded and fixed on the wiring substrate with the adhesive.

Then, the first pad 12 as the output terminal on the circuit of the semiconductor chip 11 and the second pad 5 formed on the wiring substrate are connected to each other by wire bonding using the wire 6 (metal thin wire) made of metal such as gold (wire bonding step). In wire bonding, from the plurality of second pads 5 connected to a single external terminal, the one which provides the most desirable wire length and wire angle for wire bonding is selected, thus making wire bonding easier and preventing wire contact between wires 6, which results from deformation of wires 6 occurring in a resin sealing step, etc.

After wire bonding, the surface of the wiring substrate on which surface the semiconductor chip 11 is mounted is sealed by resin to cover the semiconductor chip 11 and wires 6 so as to protect the surface of the semiconductor chip 11 and the wire bonding surface (resin sealing step).

Then, for example, solder balls are placed via flux on the external terminal mounting perforations 3 on the rear surface of the wiring substrate, and by fixing the solder balls by reflow, the conductive projections 8 (solder balls) in the form of balls made of solder are formed as the external terminals. Note that, the conductive projections 8 may include solder as the main component, such as the solder balls as described above, or may include a metal core of, for example, copper and a solder coating around it.

Then, the wiring substrate was cut and separated into individual pieces in accordance with the external size of the semiconductor device, thus manufacturing the resin sealed type semiconductor device. Note that, the semiconductor device is connected to the external circuit by melting the conductive projections 8 in a reflow furnace while controlling the surface tension and viscosity of the solder.

Note that, as described, the present embodiment described the case where the second pads 5 are provided in singularity outside of the land pattern 4 and in plurality within the land pattern 4 with respect to each wiring 2a. However, the arrangement for realizing the object of the present invention is not just limited to the described arrangement, and, for example, the second pads 5 may be provided in plurality outside of the land pattern 4 and there are no second pads 5 provided inside the land pattern 4 so long as it does not result in significant increase in external size of the semiconductor device.

That is, as long as the second pads 5 are provided in plurality for each wiring 2a, and as long as at least one of them, or preferably most or all of them are provided between the lands 4a making up the land pattern 4, it is possible to increase the degree of freedom of wire bonding and to flexibly change the second pad 5 for electrically connecting each wiring 2a to the semiconductor chip 11 by wire bonding. Further, by providing the second pads 5 between the lands 4a making up the land pattern 4, the number of second pads 5 can be increased without resulting in increase in package size, and further the layout of the wiring 2a where the wires 6 are likely to contact with each other in wire bonding can be easily changed, thus preventing the trouble of wire contact between wires 6.

That is, in the package of a conventional resin sealed type semiconductor device of a BGA type provided with a land pattern covering the external terminal mounting perforations, the metal thin wire connecting pad for making electrical conduction between the wiring pattern and the semiconductor chip was provided at a single location for each wiring (each wiring to be connected to the external terminal which is to be connected to the external circuit). Thus, this conventional arrangement offers the degree of freedom in positioning of wires only for the length of the metal thin wire connecting pad.

In the present embodiment, however, as shown in FIG. 1, the second pads 5 as the metal thin wire connecting pads for making electrical conduction between the wiring pattern 2 and the semiconductor chip 11 are provided in plurality, i.e., at least two locations with respect to each wiring 2a (each wiring 2a to be connected to the external terminal which is to be connected to the external circuit), thus having a higher degree of freedom in positioning of wires 6 than the conventional example.

Note that, in the wiring substrate as shown in FIG. 1, the second pads 5 are provided at three locations for each wiring 2a, i.e., one at outside of the land 4a on the outer most periphery, and two between corresponding lands 4a, and the second pads 5 provided on the outer periphery of the land pattern 4 are provided at one end on the outer periphery of the land pattern 4, i.e., specifically, at an outer periphery portion of the land pattern 4 on the opposite side of the semiconductor chip 11. However, alternatively, as shown in FIG. 3, the second pads 5 may be provided between the land pattern 4 and the semiconductor chip 11, i.e., between the end edge row of the lands 4a making up the land pattern 4 on the side of the semiconductor chip 11 and the semiconductor chip 11. The position of the second pads 5 when they are to be provided outside of the land pattern 4 is set appropriately within the range which does not result in considerable increase in external size of the semiconductor device.

In this manner, by also providing the second pads 5 outside of the land pattern 4, the degree of freedom in wire bonding can further be increased, and the layout of wiring 2a where the wires 6 are likely to contact with each other can be changed more easily. Further, as shown in FIG. 3, by providing the second pads 5 between the land pattern 4 and the semiconductor chip 11, when wire bonding of these second pads 5 is possible, though it depends on the wire angle, the length of wire 6 used for this wire bonding can be made shorter.

Note that, the semiconductor substrate of FIG. 3 shows an example of wire bonding of the second pads 5 provided between the end edge row of the lands 4a making up the land pattern 4 on the side of the semiconductor chip 11 and the semiconductor chip 11 with the first pad 12 of the semiconductor chip 11. However, as described, the wire bonding between the second pads 5 of each wiring 2a and the first pad 12 of the semiconductor chip 11 is made by arbitrarily selecting the second pad 5 provided for each wiring 2a so as to prevent the danger of wire contact between wires 6, and it is not limited to the connection as shown in FIG. 3.

As described, in the wiring substrate and semiconductor device in accordance with the present embodiment, even when the number of external terminals is large and the size of the semiconductor chip is smaller with respect to the external size (package size) of the semiconductor device, the wires 6 can be prevented from coming into contact with each other when wire bonding the semiconductor chip 11 with each wiring 2a provided on the wiring substrate. Further, with the described arrangement, it is not required to provide a special relay substrate, etc., in addition to the wiring pattern 2, thus providing an inexpensive arrangement. Thus, in accordance with the present embodiment, the wiring substrate and semiconductor device can be provided inexpensively and with good yield. Further, the effect of the wiring substrate of the present embodiment becomes more prominent when the size of the semiconductor chip is smaller than the external size of the semiconductor device. The semiconductor device having the described wiring substrate can be suitably adopted for the resin sealed type semiconductor device of a BGA type.

Figure 4B:
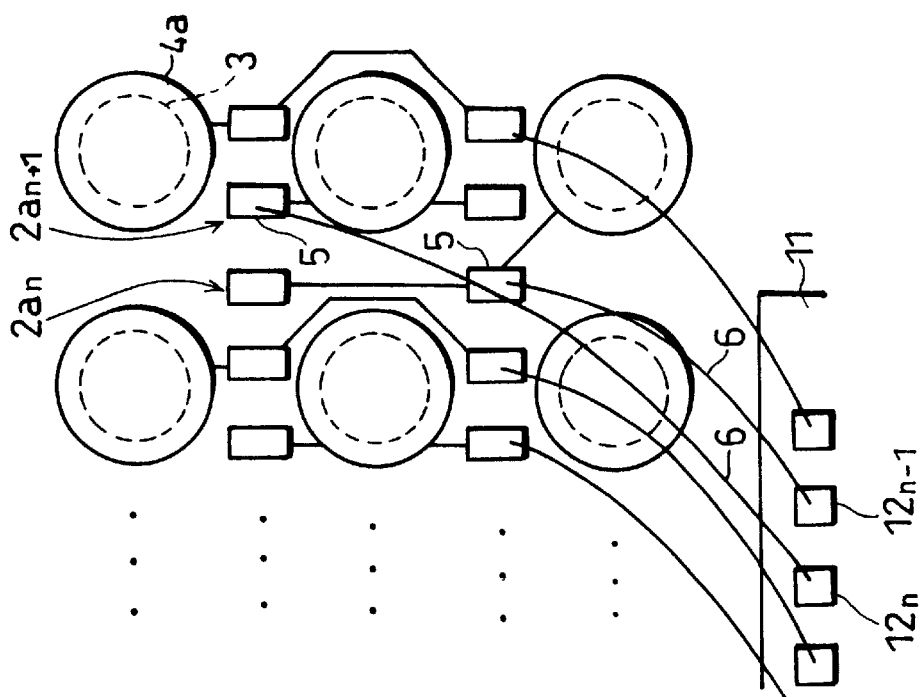
FIG. 4(a) and FIG. 4(b) are drawings explaining switching of order of input signals from external terminals to the semiconductor chip by switching of wiring to be connected in wire bonding between a first pad and a second pad.
Figure 4A:
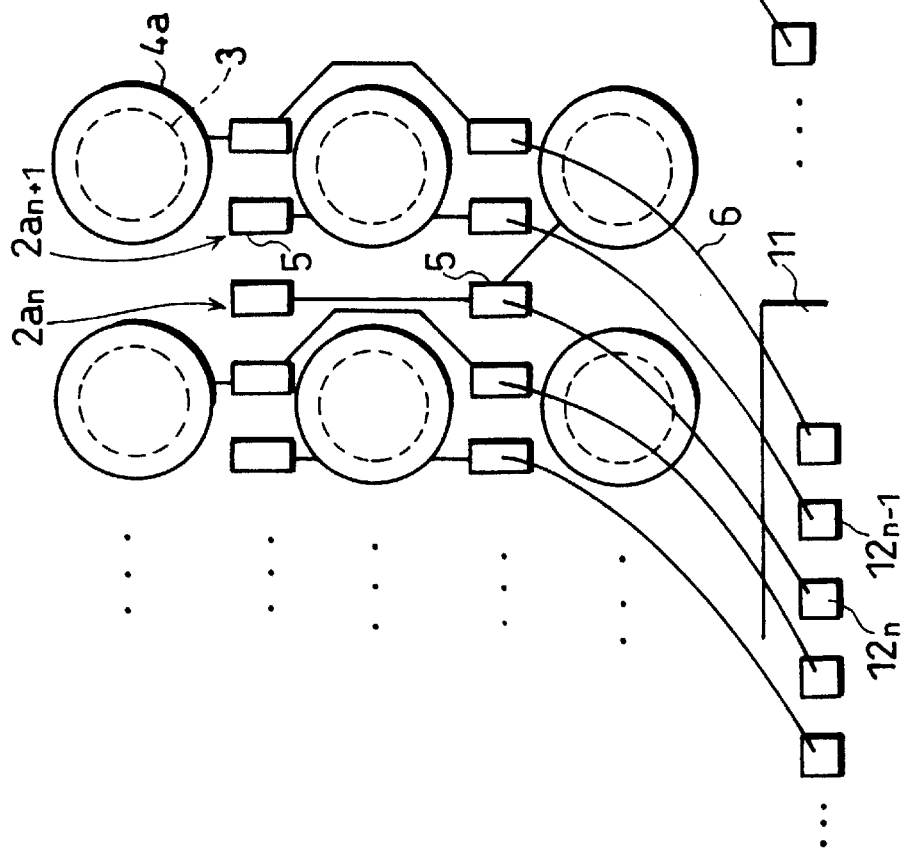

Further, with the present embodiment, by the provision of plural second pads 5, the wiring between the first pad 12 on the circuit of the semiconductor chip 11 and the second pads 5 can be made more freely. Thus, as shown in FIG. 4(a), when the wiring 2a on the nth row is wiring $2a_n$, and the wiring 2a on the (n+1)th row is wiring $2a_{n+1}$, and the first pad 12 on the nth row to be electrically connected to the wiring 2a is first pad $12_n$, and the first pad 12 on the (n+1)th row is first pad $12_{n+1}$, as shown in FIG. 4(b), the first pad $12_n$ can be wire bonded with the second pad 5 of the wiring $2a_{n+1}$, and the first pad $12_{n+1}$ can be wire bonded with the second pad 5 of the wiring $2a_n$ without causing wire contact between wires 6.

Thus, as described, in wire bonding of the first pad 12 and the second pads 5 of the wiring 2a, by switching the wiring 2a to be connected to the first pad 12, the order of input signals from the external terminals into the semiconductor chip 11 can be changed without causing wire contact between wires 6.

[Second Embodiment]

The following will describe another embodiment of the present invention referring to FIG. 1 and FIG. 2 based on FIG. 5 to FIG. 7(a) and FIG. 7(b). Note that, for convenience of explanation, constituting elements having the same functions as those described with reference to FIG. 1 of the First Embodiment are given the same reference numerals and explanations thereof are omitted here.

Figure 5:
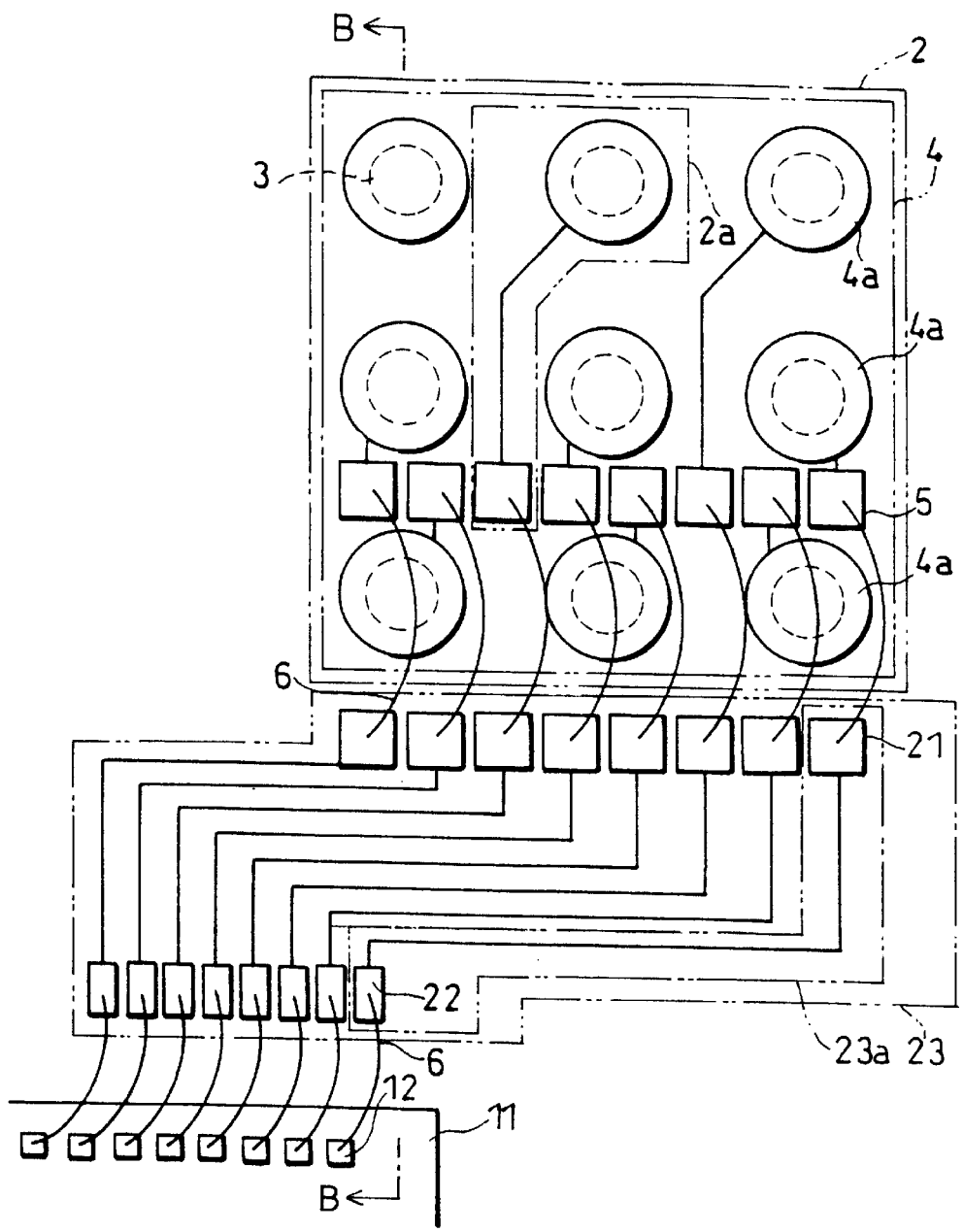
FIG. 5 is a schematic drawing showing a wiring pattern of a wiring substrate of a semiconductor device in accordance with another embodiment of the present invention.
Figure 6:
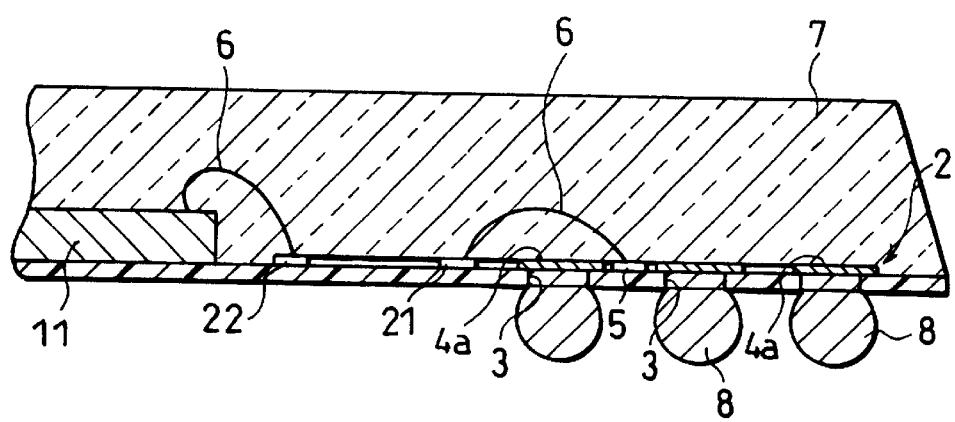
FIG. 6 is a cross sectional view of the semiconductor device of FIG. 5 taken along the line B—B.

In the semiconductor device in accordance with the present embodiment, as shown in FIG. 5 and FIG. 6, for easier connection of the second pads 5 provided between the lands 4a and the first pad 12 provided on the circuit of the semiconductor chip 11, there is provided a wiring substrate having a wiring pattern 23 composed of relay wiring 23a for electrically connecting the second pads 5 and the first pad 12 by wire bonding between the wiring pattern 2 and the semiconductor chip 11, i.e., between the lands 4a on the end edge row making up the land pattern 4 on the side of the semiconductor chip 11 and the semiconductor chip 11.

With this arrangement, even when it is difficult, as shown in FIG. 1 of the First Embodiment, to provide between lands 4 a plurality of wires 2a for connecting the external terminal of the land 4a, which is different from the above lands 4, and the semiconductor chip 11, the length of wire required for wire bonding each wiring 2a and the semiconductor chip 11 can be made shorter, thus preventing the wires 6 from coming into contact with each other.

The following will describe a manufacturing method of the wiring substrate in accordance with the present embodiment referring to FIG. 5. Note that, in the present embodiment, the base substrate 1 (see FIG. 2), wiring pattern 2, wire 6, transmissive resin 7, and conductive projections 8, along with other components are also made of the materials as described in the First Embodiment, and the method of forming each constituting element will also be regarded as the same as that of the First Embodiment unless noted otherwise. Further, in the present embodiment, the wiring pattern is made of a metal of a single layer, and thus the relay wiring pattern 23 is made of the same material as that of the wiring pattern 2.

First, the external terminal mounting perforations 3 are formed beforehand in an area array through the base substrate 1 (see FIG. 2) so as to form in advance a conduction path which connects the wiring pattern 2 to be formed on the base substrate 1 and the rear surface of the base substrate 1. Then, as with the First Embodiment, a copper foil is laminated on the base substrate 1, and the wiring pattern 2 is formed in accordance with the position of the external terminal mounting perforations 3, and relay pads 21 and 22 are provided on the relay wiring pattern 23 in accordance with the positional relationship between the wiring pattern 2 and the semiconductor chip 11 mounting region.

The wiring substrate of the semiconductor device as shown in FIG. 5 is designed so that the external terminal pitch (the distance between centers of adjacent external terminal mounting perforations 3) is 0.5 mm, and the opening diameter (ø) of the external terminal mounting perforation 3 is 0.2 mm, and the distance between an edge of the external terminal mounting perforation 3 and an edge (end) of the land 4a covering the external terminal mounting perforation 3 is 90 µm, and the line width of the wiring 2a is 40 µm, and the spacing between wiring 2a is 40 µm. Thus, only one wiring 2a can be provided between lands 4a.

Note that, the design values as noted above are appropriately set in accordance with various conditions such as the level of manufacturing technique of the manufacturer of the wiring substrate, the number of external terminals (number of signal terminals), and the package size, and design values are not limited to the above. However, there is nonetheless a limit to the number of wiring 2a which can be provided between lands 4a. Thus, the following describes the arrangement of the wiring substrate which can solve the conventional problems and achieve the object of the present invention even when the design in particular of each constituting element does not permit the arrangement of the wiring substrate of the First Embodiment, i.e., for example, the arrangement in which only single wiring 2a can be provided between lands 4a.

In the wiring substrate of the semiconductor device as shown in FIG. 5, by the above wiring rule, only single wiring 2a can be provided between the external terminals, i.e., between lands 4a. Thus, in the case where the external terminals are to be aligned in three rows (land rows of lands 4a) or above, it becomes impossible to align the second pads 5 corresponding to all external terminals in a single row outside of the land pattern 4.

Thus, in the wiring substrate of FIG. 5, the second pads 5 connected to their respective external terminals are aligned in a single row (plural rows in a direction from the side of the wiring pattern 2 toward the first pads 12 of the semiconductor chip 11) between lands 4a which are disposed along the aligned direction of the first pads 12 of the semiconductor chip 11.

Between the land pattern 4 (a group of lands 4a) and the semiconductor chip 11 mounting region, there are provided the relay pads 21 and 22 making up the relay wiring pattern 23. The relay wiring pattern 23 is provided such that the wiring 23a constituting the relay wiring pattern 23 each includes at the both ends the relay pads 21 and 22 which can be wire bonded, where the relay pad 21 at one end is provided to be connected by wire bonding to the second pad 5 which is connected to the land 4a covering the external terminal mounting perforation 3, and the relay pad 22 at the other end is provided closer to the semiconductor chip 11 and to be connected to the semiconductor chip 11 by wire bonding.

The semiconductor device in accordance with the present embodiment having the wiring substrate as shown in FIG. 5 is design ed such that the relay pads 21 and 22 at the both ends of the relay wiring pattern 23 are provided as a square pad with a side of 150 $\mu$m, and the line width of each wiring 23a making up the relay pads 21 and 22 is 40 $\mu$m. Note that, the arrangement of materials and the design size other than the above are the same as tho se described in the First Embodiment.

Also, the above described the arrangement in which only single wiring 2a can be provided between lands 4a, and the relay wiring pattern 23a is provided for each wiring 2a. However, as long as the relay wiring pattern 23a is provided at least with respect to the second pads 5 further from the semiconductor chip 11 (second pads 5 which would require a long wire if directly connected to the semiconductor chip 11), the relay wiring pattern 23 may be provided with respect to all second pads 5 to be connected to the semiconductor chip 11.

As described, in the present embodiment, even when the external terminals are fine patched and only single wiring 2a can be provided between lands 4a, electrical connection can be made by wiring the wire 6 to the second pads 5, bypassing the lands 4afrom the relay pads 21 and 22 which are provided on the relay wiring pattern 23 and which can be wire bonded.

Further, the assembling method of the semiconductor device using the described wiring substrate is carried out in accordance with the method as described in the First Embodiment. Thus, in the following, only the wire bonding step will be explained and the other steps will be omitted.

In the semiconductor device having the wiring substrate of FIG. 5, the relay wiring pattern 23 between the land pattern 4 and the semiconductor chip 11 is brought to a position in the vicinity of the semiconductor chip 11. Thus, the wire bonding between the semiconductor chip 11 and the wiring substrate in manufacturing of the semiconductor device is made by first wire bonding the semiconductor chip 11 with the relay pad 23 of the relay wiring pattern 23 on the side of the semiconductor chip 11, and then by wire bonding the relay pad 21 of the relay wiring pattern 23 on the side of the land pattern 4 with the second pad 5 which is connected to the external terminal. By making wire bonding twice in this manner, the conduction between the semiconductor chip 11 and the external terminal of each land 4a is ensured, thus manufacturing the semiconductor device in accordance with the present embodiment.

With the present embodiment, even when, for example, the number of external terminals is large, and the semiconductor chip 11 is significantly smaller than the external size (package size) of the semiconductor device, and when the pitch between external terminals is narrow and the degree of freedom in positioning of the second pads 5 is small, and in the event under these circumstances where all the wiring pattern is to be formed of a metal of a single layer, the wire 6 for wire bonding the semiconductor chip 11 with each wiring 2a provided on the wiring substrate can be made short, thus preventing wire contact between wires 6.

Further, conventionally, when the number of metal thin wire connection electrode pads is large, aligning of these pads in a single row resulted in increase in external size of the product semiconductor device, and aligning of the pads in two rows resulted in a narrow pitch between the pads and the problem of for example wire contact had occurred. However, with the use of the wiring substrate having the described arrangement, conduction between the semiconductor chip 11 and the external terminals can be ensured without providing a plurality of wiring 2a between adjacent lands 4a, and the wires 6 are prevented from coming into contact with each other, thus realizing the wiring substrate and semiconductor device with a good yield.

Further, in the present embodiment, the wiring pattern 2 and the relay wiring pattern 23 can be formed of a metal of a single layer, thus inexpensively manufacturing the wiring substrate and semiconductor device having the described arrangements.

As described, the semiconductor device provided with the wiring substrate of the present embodiment can be suitably adopted as a resin sealed type semiconductor device having a BGA arrangement, and the wiring substrate is particularly effective when the size of the semiconductor chip is smaller than the external size of the semiconductor device.

Figure 7A:
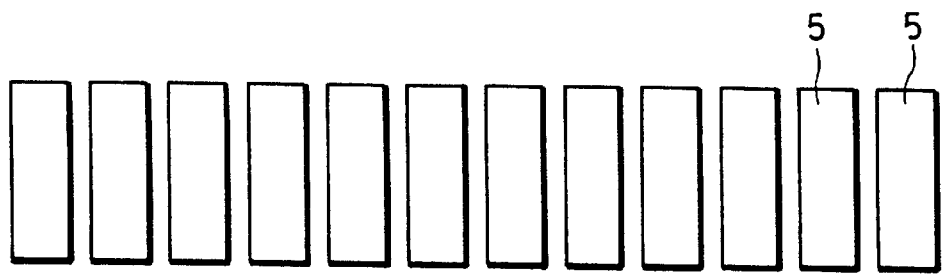
FIG. 7(a) and FIG. 7(b) are examples of disposition when configuration of second pads partially provided on the wiring pattern of FIG. 1
Figure 7B:
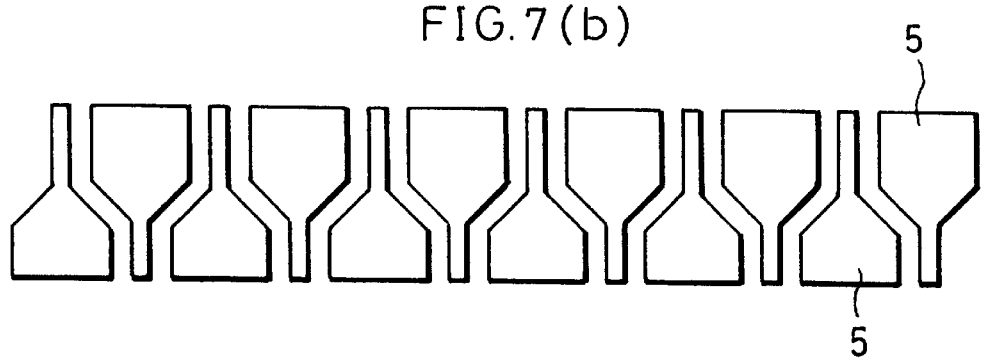
Figure 8:
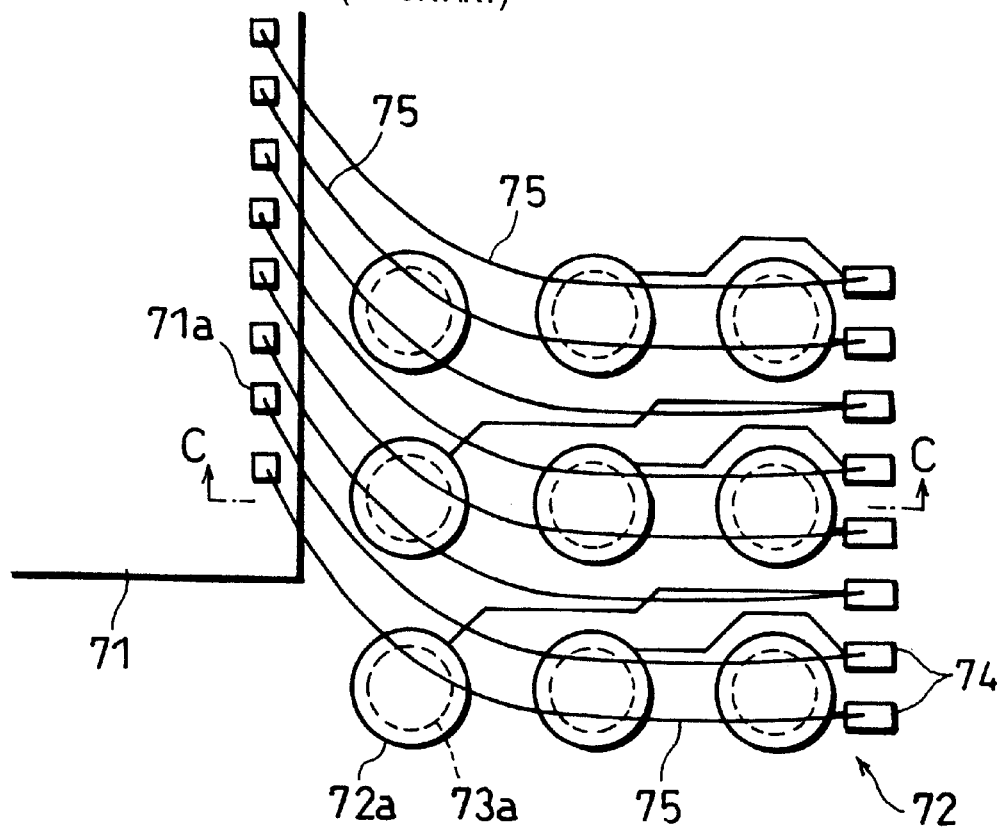
FIG. 8(a) is a schematic drawing showing a wiring pattern of a conventional semiconductor device of a BGA type and which employs wires.
FIG. 8(b) is a cross sectional view of the semiconductor device of FIG. 8(a) taken along the line C—C.
Figure 8:
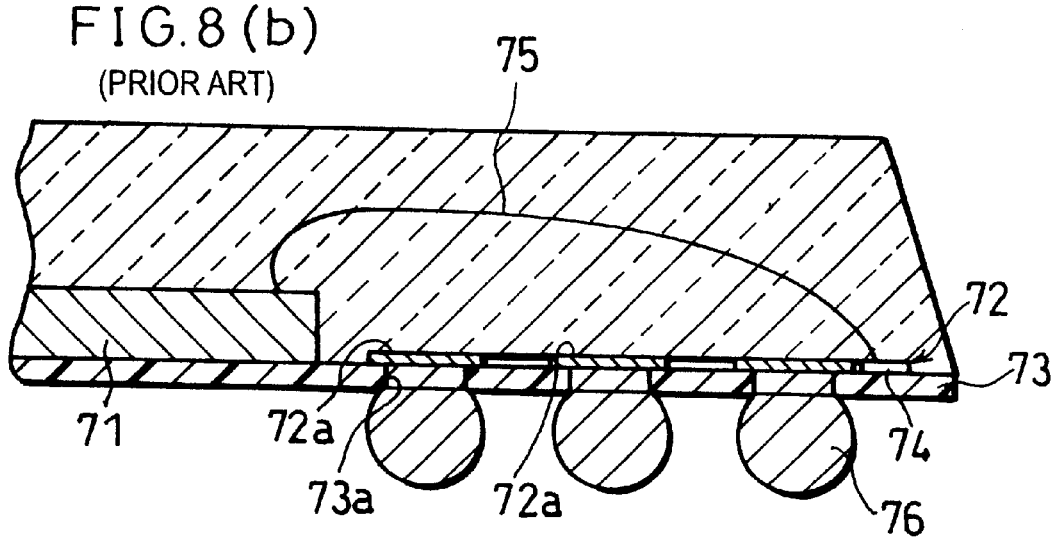
Figure 9:
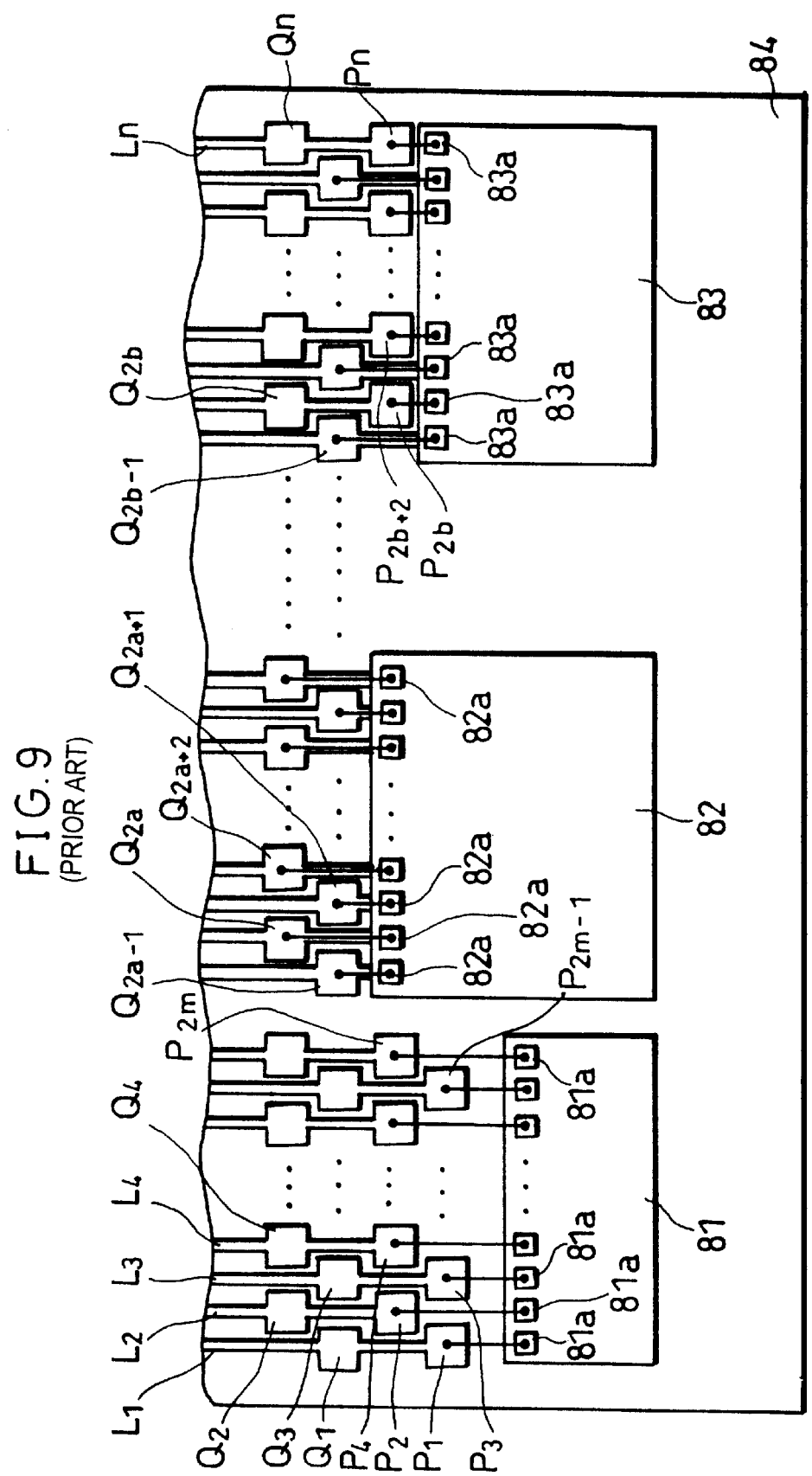
FIG. 9 is a plan view of a substrate showing another conventional wiring pattern.
Figure 10:
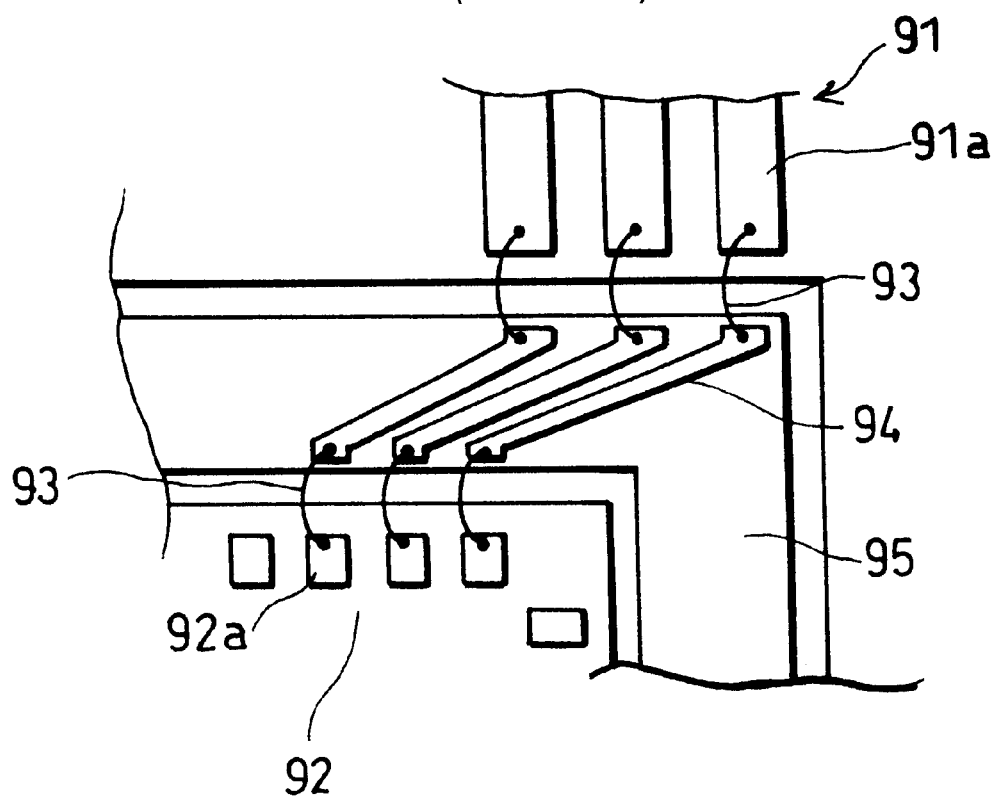
FIG. 10 is a schematic drawing showing a structure of a conventional ceramic package including a relay circuit.

Note that, in the present embodiment, even though the second pad 5 is configured to be a square, it is possible alternatively to adopt a rectangle as shown in FIG. 7(a), or a quadrilateral other than square and rectangle, and, as shown in FIG. 7(b), it is even possible to adopt a pentagon (shape with a projection at one of the apices) as the shape of the second pad 5, and the second pads 5 are aligned parallel to each other by being rotated through 180° alternately. With this arrangement of the second pads 5, compared with the second pads 5 having the same occupied area, the width of the second pads 5, i.e., the size of second pads 5 in a direction parallel to the first pad 12, can be widened in effect, and the problems of increase in external size and of wire contact between wires 6 can be prevented further effectively. Also, by adopting the arrangement as shown in FIG. 7(b) for the second pads 5, in particular, for the second pads 5 outside of the land pattern 4 of the First Embodiment, the problems of increase in external size and of wire contact between wires 6 can be prevented further effectively.

A first wiring substrate of the present invention includes a wiring pattern provided per each wiring with a land covering a perforation for mounting an external terminal, the land being provided on a side of the wiring pattern on which side a semiconductor chip is mounted, wherein a plurality of electrode terminals (e.g., metal thin wire connection electrode pads having a quadrilateral or pentagonal shape) for electrically connecting the wiring and the semiconductor chip by wire bonding are provided per each wiring, and at least one of the plurality of electrode terminals is provided between lands.

With this arrangement, by the provision of the plurality of electrode terminals per each wiring, the electrode terminals for electrically connecting each wiring and the semiconductor chip can be flexibly changed. Further, by the provision of the electrode terminals between lands, the number of electrode terminals can be increased without causing increase in external size (package size) of the semiconductor device), and also the layout of wiring where wires are likely to contact with each other in wire bonding can be easily changed, and the trouble such as wire contact between wires can be prevented.

Thus, with the above arrangement, even when the number of, for example, external terminals is large and the semiconductor chip is smaller than the external size (package size) of the semiconductor device, the wires are prevented from coming into contact with each other in wire bonding between the semiconductor chip and each wiring provided on the wiring substrate. Further, with the above arrangement, it is not required to provide a special relay substrate, etc., in addition to the wiring pattern, thus realizing an inexpensive arrangement. As a result, it is possible to provide a wiring substrate which can realize an inexpensive semiconductor device which can be manufactured with a good yield.

A second wiring substrate of the present invention includes a wiring pattern provided per each wiring with a land covering a perforation for mounting an external terminal, the land being provided on a side of the wiring pattern on which side a semiconductor chip is mounted, wherein electrode terminals for electrically connecting the wiring and the semiconductor chip by wire bonding are provided between lands, and relay wiring (e.g., wiring having relaying metal thin wire connecting pads at the both ends) for electrically connecting the electrode terminals and the semiconductor chip by wire bonding is provided between the wiring pattern and a semiconductor mounting region.

With this arrangement, even when the number of, for example, external terminals is large and the semiconductor chip is considerably smaller than the external size (package size) of the semiconductor device, or in the case where the external terminal pitch is narrow and there is no degree of freedom in positioning of the electrode terminals, or even when all wiring patterns are to be made of a metal of a single layer, the length of the wire used for wire bonding of the semiconductor chip and each wiring can be made shorter, thus preventing wire contact. Thus, with the above arrangement, it is possible to provide a wiring substrate which can realize an inexpensive semiconductor device which can be manufactured with a good yield.

A semiconductor device of the present invention includes the first or second wiring substrate.

With this arrangement, because the semiconductor device includes the wiring substrate, even when the semiconductor chip is smaller than the package size, the wire length can be reduced, and it is possible to inexpensively provide a semiconductor device with a good yield, in which no wire contact occurs.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A wiring substrate comprising:
    a wiring pattern formed on a substrate, the wiring pattern provided with at least one wiring and a plurality of separate and distinct conductive lands, each land covering a perforation defined in the substrate, each perforation for mounting an external terminal, each said lands being provided on a side of the substrate on which a semiconductor chip is mounted,
    wherein the wiring includes a first one of the lands and a plurality of electrode terminals provided for a wire, the electrode terminals of said wiring being spaced from one another and being electrically connected to one another, and
    wherein at least one of the plurality of electrode terminals of the wiring is provided in a space between the first land and a second one of the lands, said first and second lands being provided side by side in a direction extending from a mounting area of the semiconductor chip toward an edge of the substrate.

2. The wiring substrate as set forth in claim 1, wherein at least one of the plurality of electrode terminals is provided outside of a land forming region of the wiring pattern with which the at least one electrode terminal is associated.

3. The wiring substrate as set forth in claim 2, wherein at least one of the plurality of electrode terminals is provided between the land forming region and an edge portion of the substrate.

4. The wiring substrate as set forth in claim 2, wherein at least one of the plurality of electrode terminals is provided between the land forming region and a semiconductor chip mounting region.

5. The wiring substrate as set forth in claim 1, wherein the wiring pattern is made of an electrically conductive material of a single layer.

6. A wiring substrate comprising:
    a wiring pattern on a substrate, the wiring pattern provided with a wiring and a plurality of conductive lands covering corresponding perforations, each perforation for mounting an external terminal to the substrate,
    wherein the wiring includes a first one of the lands and a plurality of electrode terminals provided for a wire, the electrode terminals of said wiring being spaced from one another and being electrically connected to one another, and
    wherein at least one of the plurality of electrode terminals of said wiring is provided in a space between the first land and a second one of the lands outside of a semiconductor chip mounting, region of the substrate.

7. A wiring substrate comprising:
    a wiring pattern formed on a substrate, the wiring pattern being provided with a plurality of lands, each land covering a perforation in the substrate that is for mounting an external terminal, each land being provided on a side of the substrate on which a semiconductor chip is mounted,
    a wiring of the pattern including a first one of the lands and an electrode terminal provided for a wire,
    wherein the electrode terminal of said wiring is provided in a space between the first land and a second one of the lands, wherein the first and second lands are provided side by side in a direction extending from a mounting area of the semiconductor chip to an edge of the substrate, and relay wiring for electrically connecting the electrode terminal and the semiconductor chip by wire bonding is provided on the substrate between the wiring pattern and a semiconductor mounting region of the substrate.

8. The wiring substrate as set forth in claim 7, wherein said relay wiring includes:

a first electrode pad which is provided for wire bonding and in a vicinity of the wiring pattern, and a second electrode pad which is provided for wire bonding and in a vicinity of the semiconductor chip mounting region, and which is electrically connected to the first electrode pad.

9. The wiring substrate as set forth in claim 7, wherein said wiring pattern and said relay wiring are each made of an electrically conductive material of a single layer.

10. A semiconductor device comprising:

a wiring substrate which includes a wiring pattern provided with a plurality of separate and distinct lands, each land covering a perforation in the substrate for mounting an external terminal, each land being provided on a side of the substrate on which a semiconductor chip is mounted, a wiring of the pattern including a first one of the lands and a plurality of electrode terminals provided for a wire, the electrode terminals of said wiring being spaced from one another and being electrically connected to one another, and wherein at least one of the electrode terminals of the wiring is provided in a space between the first land and a second one of the lands, said first and second lands being provided side by side in a direction extending from a mounting area of the semiconductor chip toward an edge of the substrate.

11. A semiconductor device comprising:

a wiring substrate which includes a wiring pattern with a plurality of lands, each land covering a perforation in the substrate for mounting an external terminal, a wiring of the wiring pattern including at least a first one of the lands and an electrode terminal provided for a wire, wherein the electrode terminal of the wiring is provided in a space between the first land and a second one of the lands, and relay wiring for electrically connecting the electrode terminal and the semiconductor chip by wire bonding is provided on the substrate.

\* \* \* \* \*

UNITED STATES PATENT AND TRADEMARK OFFICE
CERTIFICATE OF CORRECTION

PATENT NO. : 6,403,895 B1
DATED : June 11, 2002
INVENTOR(S) : Sota

It is certified that error appears in the above-identified patent and that said Letters Patent is hereby corrected as shown below:

<u>Title page,</u>
Item [56], FOREIGN PATENT DOCUMENTS, the first reference 1-88460 is incorrect as shown. The correct JP reference should be -- 1-84460 --.

Signed and Sealed this

Third Day of December, 2002

JAMES E. ROGAN
*Director of the United States Patent and Trademark Office*